US009564693B2

(12) United States Patent
Fukuda

(10) Patent No.: US 9,564,693 B2
(45) Date of Patent: Feb. 7, 2017

(54) GROUND CONNECTION STRUCTURE FOR SHIELD WIRE

(75) Inventor: Kiyohito Fukuda, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 32 days.

(21) Appl. No.: 14/240,862

(22) PCT Filed: Aug. 30, 2011

(86) PCT No.: PCT/JP2011/069628
§ 371 (c)(1),
(2), (4) Date: Feb. 25, 2014

(87) PCT Pub. No.: WO2013/030955
PCT Pub. Date: Mar. 7, 2013

(65) Prior Publication Data
US 2014/0202728 A1    Jul. 24, 2014

(51) Int. Cl.
*H01R 4/66* (2006.01)
*H01R 4/64* (2006.01)
(Continued)

(52) U.S. Cl.
CPC ........ *H01R 4/66* (2013.01); *H01R 4/64* (2013.01); *H01R 4/646* (2013.01); *H01R 9/0512* (2013.01);
(Continued)

(58) Field of Classification Search
CPC ........... H01R 4/66; H01R 4/646; H01R 9/032; H01R 9/0512; H01R 9/0518; H01R 9/0527; H01R 4/24; H01R 4/64; H01R 4/658; H01R 9/034; H01R 9/0503; H01R 9/0524
(Continued)

(56) References Cited

U.S. PATENT DOCUMENTS 5,468,911 A * 11/1995 Leve .................. H01R 4/646
174/73.1
5,691,506 A    11/1997 Miyazaki et al.
(Continued)

FOREIGN PATENT DOCUMENTS

EP    0704940 A3    6/1996
EP    0704940 B1    6/1999
(Continued)

OTHER PUBLICATIONS

The extended European Search Report letter issued on Mar. 16, 2015 in the counterpart European application.
(Continued)

*Primary Examiner* — Ishwarbhai B Patel
*Assistant Examiner* — Paresh Paghadal
(74) *Attorney, Agent, or Firm* — Mots Law, PLLC

(57) ABSTRACT

There are provided: a shield projecting portion (4A) being a part of a shield layer (4) of a shield wire (1) projected outside of an exterior covering (5) to be exposed; an annular member for grounding (10, 10A, 10B) disposed in a position surrounding an outer circumference of the shield wire (1) and including a housing chamber (12, 22) having an opening (13) along an annular shape of the annular member for grounding and being configured to house the shield projecting portion (4A) and a ground wire (7) inserted from the opening (13); and a push-in member (20, 20B) inserted from the opening (13) and housed in the housing chamber (12, 22) after insertion of the ground wire (7) and the shield projecting portion (4A) to bring the shield projecting portion (4A) and the ground wire (7) into close contact with each other.

10 Claims, 14 Drawing Sheets

(51) Int. Cl.
 *H01R 9/05* (2006.01)
 *H05K 9/00* (2006.01)
 *H01R 4/24* (2006.01)
 *H01R 9/03* (2006.01)

(52) U.S. Cl.
 CPC .......... *H01R 9/0527* (2013.01); *H05K 9/0098* (2013.01); *H01R 4/24* (2013.01); *H01R 9/034* (2013.01)

(58) Field of Classification Search
 USPC . 439/98, 99; 174/72 A, 73.1, 75 D, 75 F, 78
 See application file for complete search history.

(56) References Cited

U.S. PATENT DOCUMENTS

| | | | | |
|---|---|---|---|---|
| 5,707,253 | A * | 1/1998 | Matsumoto et al. | 439/607.5 |
| 6,152,746 | A * | 11/2000 | Brown | 439/99 |
| 6,648,683 | B2 * | 11/2003 | Youtsey | H01R 9/0527 439/578 |
| 7,044,756 | B1 * | 5/2006 | Asakura et al. | 439/98 |
| 7,491,071 | B2 * | 2/2009 | Hamai et al. | 439/98 |
| 7,726,985 | B2 * | 6/2010 | Gladd et al. | 439/98 |
| 2006/0128223 | A1 * | 6/2006 | Asakura et al. | 439/610 |
| 2007/0178743 | A1 * | 8/2007 | Sakaguchi | H01R 9/032 439/404 |

FOREIGN PATENT DOCUMENTS

| | | | | |
|---|---|---|---|---|
| JP | S56-159917 | A | 12/1981 | |
| JP | S57-156612 | * | 9/1982 | ............... H01R 4/60 |
| JP | S57-156612 | A | 9/1982 | |
| JP | H08-340615 | A | 12/1996 | |
| JP | 2001-286025 | * | 10/2001 | ............... H02G 1/14 |
| JP | 2001-286025 | | 10/2001 | |
| JP | 2006-344487 | A | 12/2006 | |
| JP | 2008-125200 | A | 5/2008 | |

OTHER PUBLICATIONS

The Chinese office action letter issued on Dec. 31, 2015 in the counterpart Chinese patent application.

* cited by examiner

FIG. 7
(a)
(b)
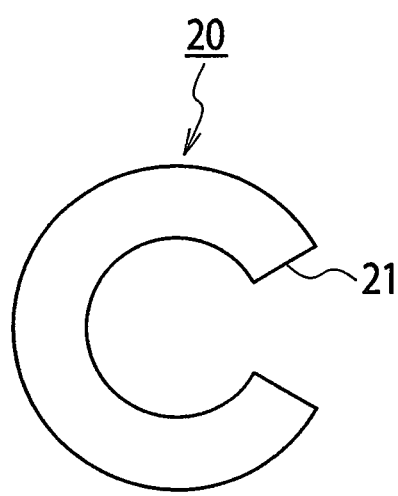
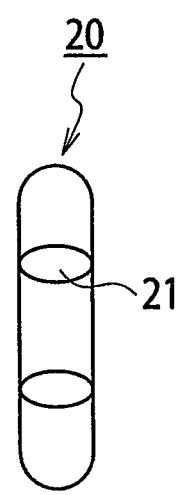

GROUND CONNECTION STRUCTURE FOR SHIELD WIRE

TECHNICAL FIELD

The present invention relates to a ground connection structure for a shield wire.

BACKGROUND ART

Patent Literature 1 (hereafter referred to as first conventional example) and patent literature 2 (hereafter referred to as second conventional example) disclose ground connection structures for shield wire.

FIG. 1 shows a structure of the first conventional example. At an end part of a shield wire 1100 shown in FIG. 1, an exterior covering 1104, a shield layer 1103, and an insulation layer 1102 are stripped off and a signal wire 1101 is exposed. The exterior covering 1104 is stripped off at the longest dimension, and the exposed shield layer 1103 is folded back over the exterior covering 1104. A compression bonding member 1112 for grounding is attached to a folding back place of the shield layer 1104 and an end part of a ground wire 1111 by caulking.

In the first conventional example, the shield layer 1104 and the ground wire 1111 are connected together by the compression bonding member 1112.

FIGS. 2 to 4 show the second conventional example. In FIGS. 2 and 3, in a state in which a shield layer 103 is projected from an exterior covering 104 to outside, an exposed shield projecting portion 103A is formed on a shield wire 100. The shield projecting portion 103A is held between one pair of holding portions 121 of a holding member for grounding 120. Caulking portions 121a are provided at tip parts of the pair of holding portions 121, respectively. As shown in FIG. 4, both the caulking portions 121a are caulked to conduct compression bonding on ground wires 111. The paired holding portions 121 are fixed by both the caulking portions 121a.

In the second conventional example, the shield layer 103 and the ground wires 111 are connected together by the holding member for grounding 120.

CITATION LIST

Patent Literature

Patent Literature 1: Japanese Unexamined Patent Application Publication No. 8-340615 (see FIG. 4)
Patent Literature 2: Japanese Unexamined Patent Application Publication No. 2006-344487 (see FIG. 5(a) and (b))

SUMMARY OF INVENTION

In the first conventional example, however, compression bonding force of the compression bonding member 1112 for grounding acts upon the insulation layer 1102 of the shield wire 1100 and the insulation layer 1102 is, for example, deformed by compression. As a result, there is a fear that the signal wire 1101 will be short-circuited to the shield layer 1103.

In the second conventional example, compressive force does not act on an insulation layer 102. Accordingly, the above-described trouble does not occur. Since it is necessary to conduct caulking working on the holding member for grounding 120, however, the work efficiency in manufacture is poor.

An object of the present invention is to provide a ground connection structure for a shield wire that brings about high work efficiency in manufacture without a fear of short-circuit between a signal wire and a shield layer.

An aspect of the present invention is a ground connection structure for a shield wire, including: a shield projecting portion being a part of a shield layer of the shield wire projected outside of an exterior covering to be exposed; an annular member for grounding disposed in a position surrounding an outer circumference of the shield wire, the annular member for grounding including a housing chamber having an opening along an annular shape of the annular member for grounding and being configured to house the shield projecting portion and a ground wire inserted from the opening; and a push-in member inserted from the opening and housed in the housing chamber after insertion of the ground wire and the shield projecting portion to bring the shield projecting portion and the ground wire into close contact with each other.

The annular member for grounding may be elastically deformable in directions to expand the opening, the push-in member may be inserted into the housing chamber by expanding the opening with elastic deformation, and the opening of the housing chamber may be configured to return to an original size after insertion of the push-in member into the housing chamber.

The annular member for grounding may include locking claws configured to project into the housing chamber and lock the push-in member inserted into the housing chamber.

Each of the annular member for grounding and the push-in member may include a notch formed by opening a part of an annular shape.

The annular member for grounding may include slits opening to the opening on an inner circumference wall of the annular member for grounding.

According to the above-described configuration, the shield projecting portion and the ground wire are brought into close contact with each other in the annular member for grounding. As a result, any external force does not act on places other than the shield projecting portion, and a situation in which the signal wire is short-circuited to the shield layer does not occur. At the time of manufacture work, it is sufficient to insert the push-in member together with the shield projecting portion into the annular member for grounding which is set around the outer circumference of the shield wire 1. It is not necessary to conduct troublesome caulking working. Owing to the points described above, there is no fear that the signal wire will be short-circuited to the shield layer, and the work efficiency in manufacture is high.

BRIEF DESCRIPTION OF DRAWINGS

FIG. 6(a) is a left side view of an annular member for grounding, FIG. 6(b) is a front view of the annular member for grounding, and FIG. 6(c) is a sectional view taken along a VIc-VIc line in FIG. 6(b).

FIGS. 7(a) and 7(b) show the first embodiment of the present invention, FIG. 7(a) is a front view of a push-in member, and FIG. 7(b) is a left side view of the push-in member.

FIGS. 8(a) to 8(d) are front views showing processes for forming a shield projecting portion, respectively.

FIG. 12(a) is a front view of an annular member for grounding, and FIG. 12(b) is a sectional view taken along a XIIb-XIIb line in FIG. 12(a).

FIG. 13(a) is a front view of a push-in member, and FIG. 13(b) is a left side view of the push-in member.

FIG. 16(a) is a left side view of an annular member for grounding, FIG. 16(b) is a front view of the annular member for grounding, and FIG. 16(c) is a sectional view taken along a XVIc-XVIc line in FIG. 16(b).

FIG. 17(a) is a left side view of a push-in member, FIG. 17(b) is a front view of the push-in member, and FIG. 17(c) is a sectional view taken along a XVIIc-XVIIc line in FIG. 17(b).

DESCRIPTION OF EMBODIMENTS

Figure 1:
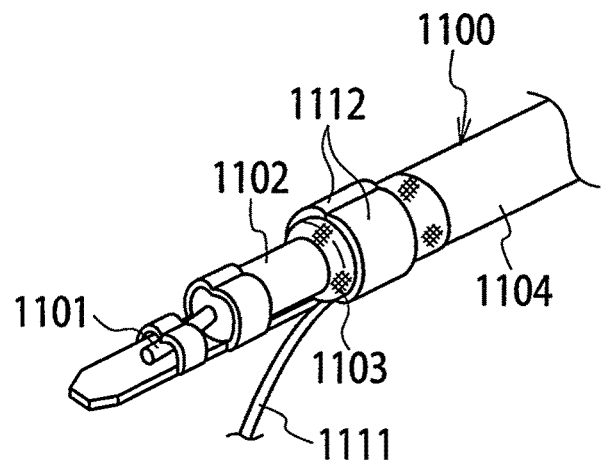
FIG. 1 is a perspective view of a ground connection structure for a shield wire according to a first conventional example.
Figure 2:
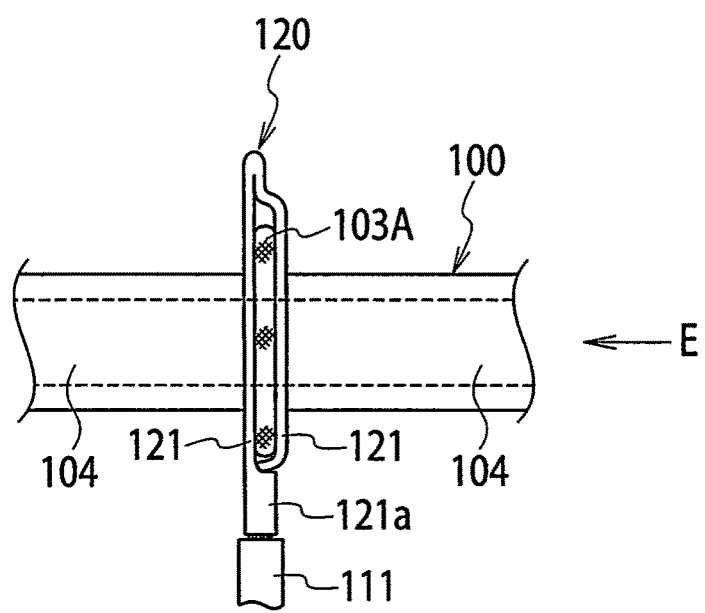
FIG. 2 is a front view of a ground connection structure for a shield wire according to a second conventional example.
Figure 3:
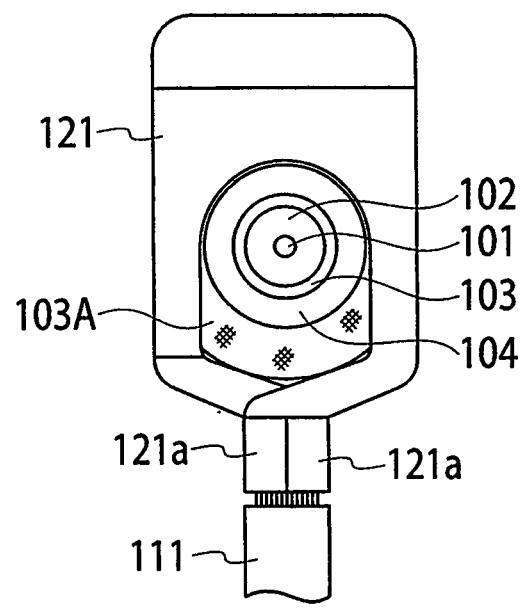
FIG. 3 shows the second conventional example and a view seen from a direction of an arrow E in FIG. 2.
Figure 4:
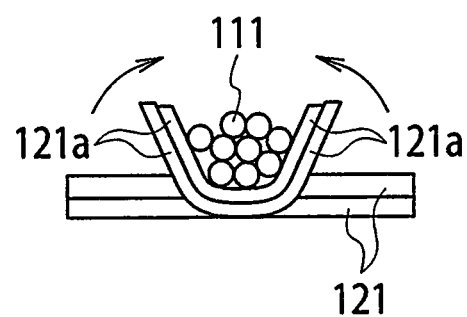
FIG. 4 shows the second conventional example, and is a diagram showing a caulking working process of both caulking portions.

In the following, embodiments of the present invention will be described with reference to the drawings.
First Embodiment FIGS. 5 to 10 show a ground connection structure 50 for a shield wire 1 according to a first embodiment of the present invention. First, a structure of the shield wire 1 will now be described. As shown in FIGS. 8(a) to 8(d) in detail, the shield wire 1 includes a signal wire 2 which is a conductor, an insulation layer 3 which covers an outer circumference of the signal wire 2, a shield layer 4 arranged to cover an outer circumference of the insulation layer 3, an insulative exterior covering 5 which covers an outer circumference of the shield layer 4. The shield layer 4 is formed of a braid wire or metal foils.

Figure 5:
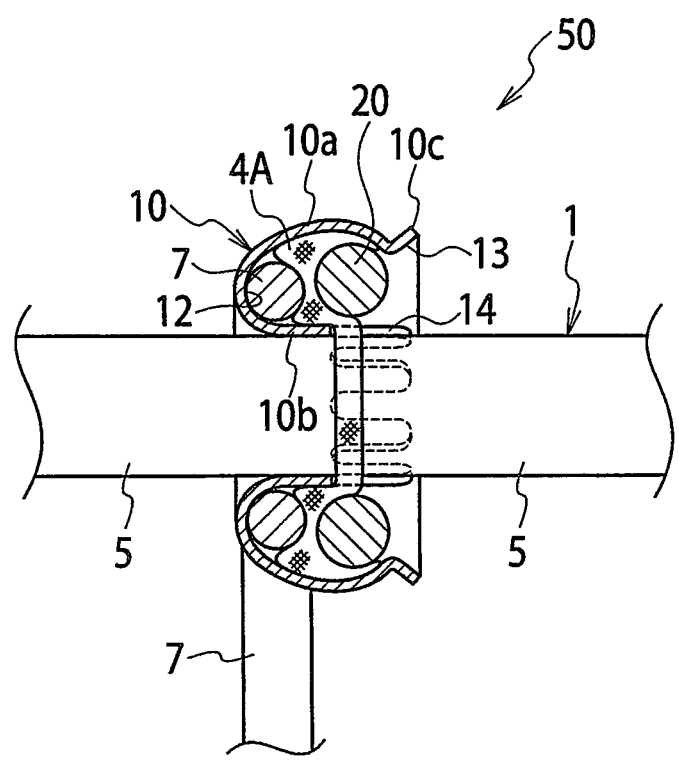
FIG. 5 is a sectional view of a ground connection structure for a shield wire according to a first embodiment of the present invention.
Figure 6:
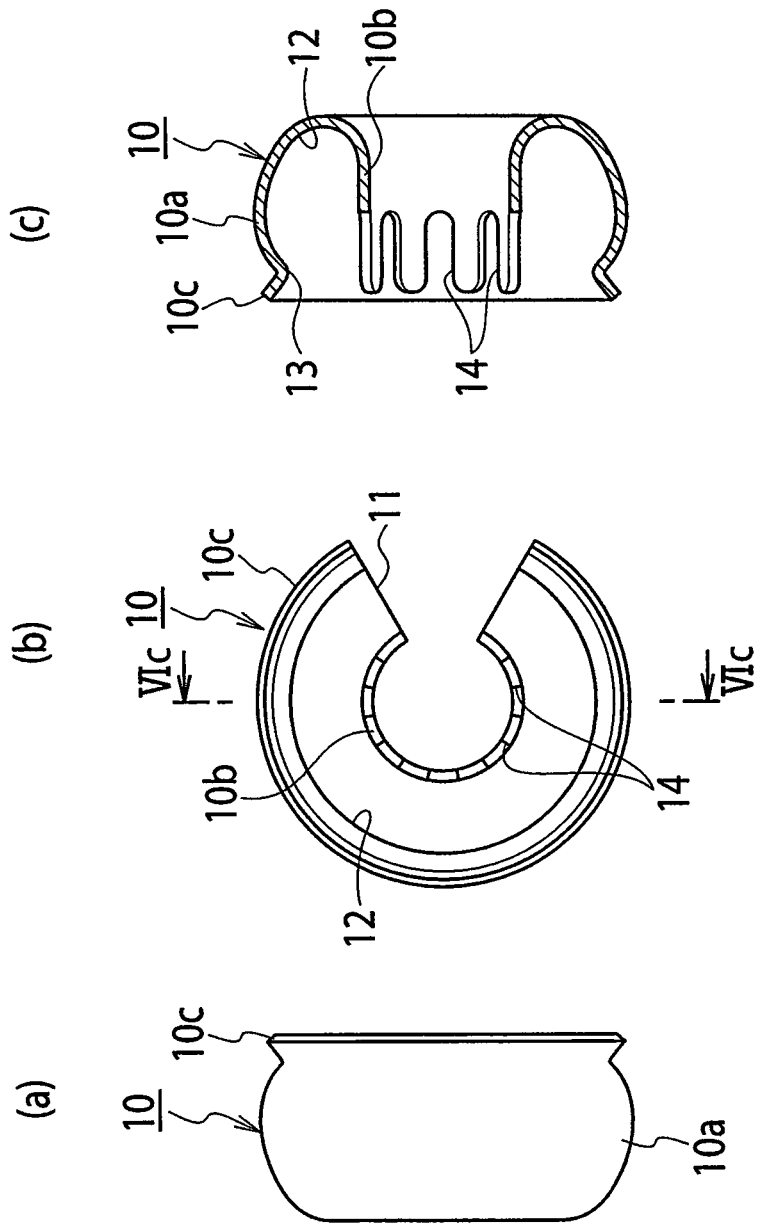
FIGS. 6(a) to 6(c) show the first embodiment of the present invention.
Figure 8:
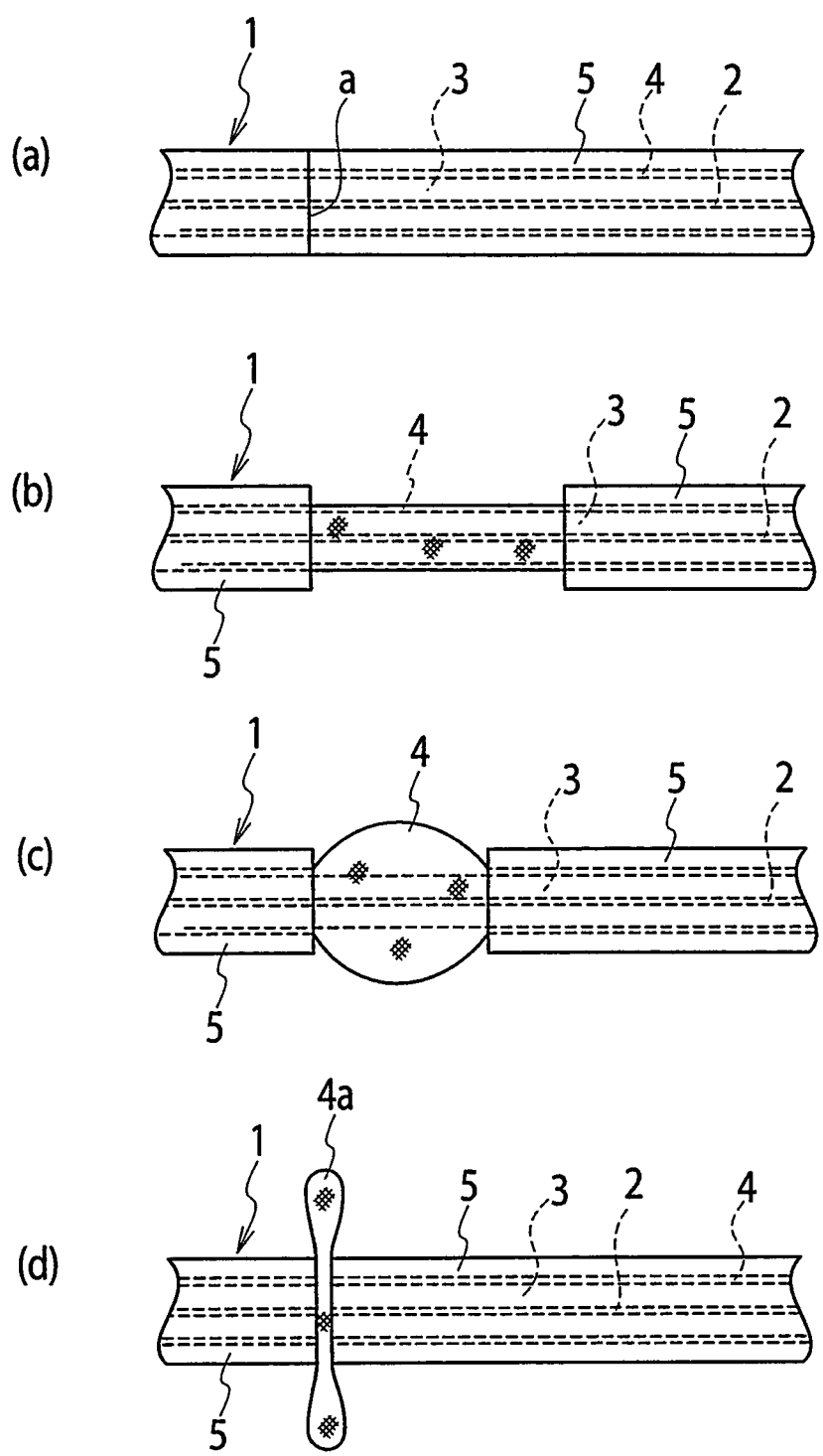
FIGS. 8(a) to 8(d) show the first embodiment of the present invention.

A shield projecting portion 4A where the shield layer 4 projects outside of the exterior covering 5 is provided in an intermediate place of the shield wire 1 having such a configuration. As shown in FIG. 5, the shield projecting portion 4A is connected to a ground wire 7 by using an annular member for grounding 10 and a push-in member 20. Hereafter, the structure of the shield wire 1 will be described in detail.

As shown in FIG. 5, the annular member for grounding 10 is arranged in a position that surrounds an outer circumference of the shield wire 1. As shown in detail in FIGS. 6(a) to 6(c), the annular member for grounding 10 is made of conductive metal and is an annular member having a notch 11 formed by opening a partial area. A cross section takes a shape of nearly an elliptical frame. The annular member for grounding 10 has a housing chamber 12 inside. In the housing chamber 12, an opening 13 is formed along an annular shape. An edge portion 10c of an outer circumference wall 10a included in the opening 13 takes a shape extending to the outside to make it possible to insert the push-in member 20 therein smoothly. The annular member for grounding 10 can elastically deform in directions to expand a width of the opening 13. A plurality of slits 14 are formed on an inner circumference wall 10b of the annular member for grounding 10 at intervals in a circumference direction. Each slit 14 opens to the opening 13.

One end side of the ground wire 7 with the exterior covering stripped off, the shield projecting portion 4A, and the push-in member 20 are housed in the housing chamber 12 of the annular member for grounding 10 in a close contact state.

As for the ground wire 7, one end side thereof with the exterior covering stripped off is housed in the housing chamber 12. In a case where the shield wire 1 is arranged, for example, on a vehicle, the other end of the ground wire 7 is connected to a vehicle body.

The shield projecting portion 4A enters the housing chamber 12 from each slit 14 of the annular member for grounding 10 and is in close contact with the ground wire 7 closely.

As shown in detail in FIGS. 7(a) and 7(b), the push-in member 20 is made of conductive metal and is a ring-shaped member having a notch 21 opened in a partial area thereof. The push-in member 20 has a diameter that is slightly larger in dimension than the width of the opening 13 of the annular member for grounding 10. Once the push-in member 20 is inserted into the housing chamber 12, the width of the opening 13 returns to its original dimension due to elasticity and consequently the housed push-in member 20 does not slip off from the opening 13.

An assembling procedure of the ground connection structure 50 for the shield wire 1 will now be described briefly. First, working of the shield wire 1 will be described. As shown in FIG. 8(a), a notch "a" is made on the whole circumference of the exterior covering 5 in a position in an intermediate place of the shield wire 1 where the ground wire 7 is desired to be connected. Then, using the notch "a" as a borderline, parts of the exterior covering 5 located on both sides thereof are moved in directions away from each other. As a result, the shield layer 4 is exposed in an area where the parts of the exterior covering 5 are separated. Then, the moved parts of the exterior covering 5 are moved toward their original position. As a result, the exposed shield layer 4 swells in outside directions. If the parts of the exterior covering 5 on both sides finish in moving in close positions, the shield projecting portion 4A is formed by the exposed shield layer 4.

Figure 9:
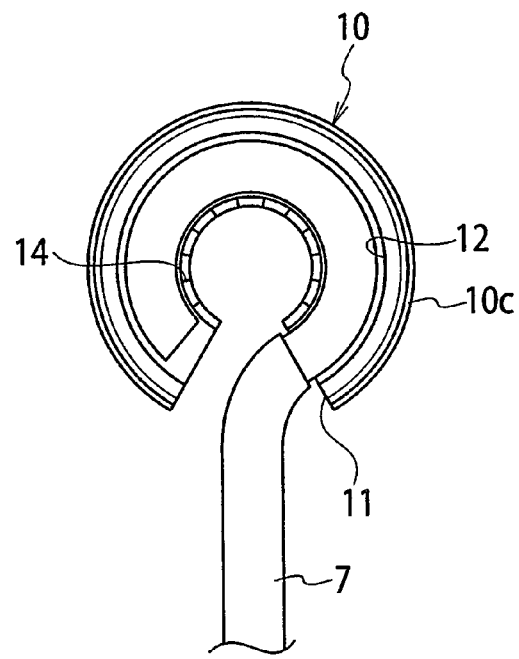
FIG. 9 is a perspective view showing a manufacture process of the ground connection structure according to the first embodiment of the present invention.

Then, as shown in FIG. 9, one end part of the ground wire 7 with the exterior covering stripped off is housed into the housing chamber 12 of the annular member for grounding 10.

Figure 10:
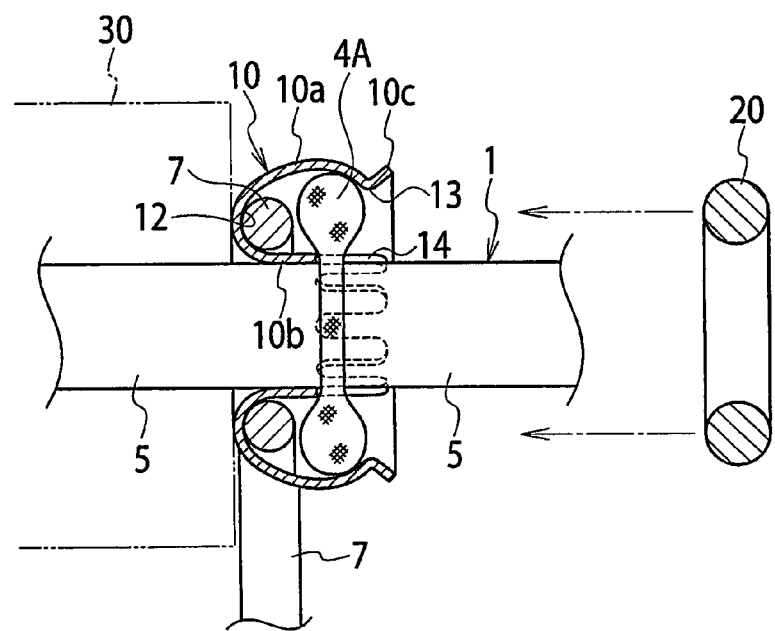
FIG. 10 is a sectional view showing a manufacture process of the ground connection structure according to the first embodiment of the present invention.
Figure 11:
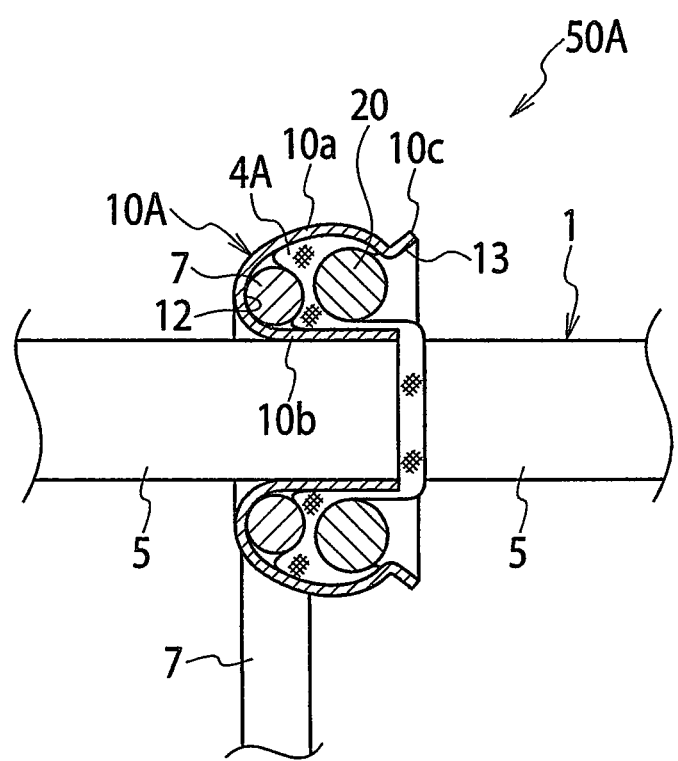
FIG. 11 is a sectional view of a ground connection structure for a shield wire according to a second embodiment of the present invention.
Figure 12:
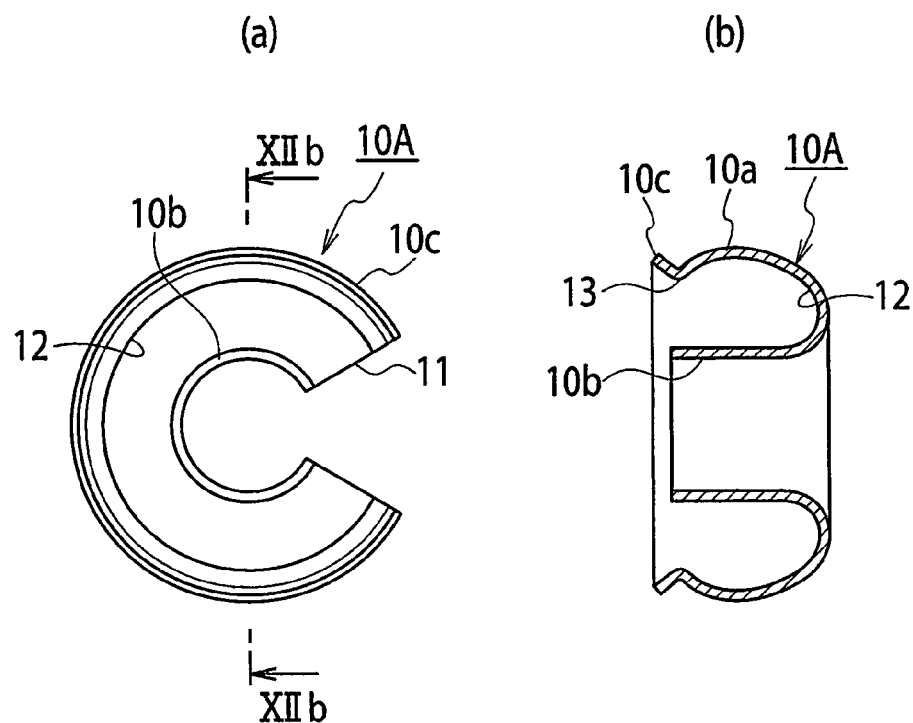
FIGS. 12(a) and 12(b) show the second embodiment of the present invention.
Figure 13:
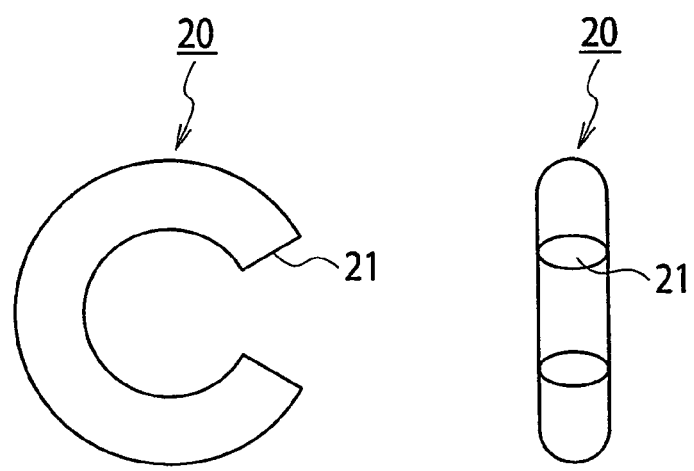
FIGS. 13(a) and 13(b) show the second embodiment of the present invention.
Figure 14:
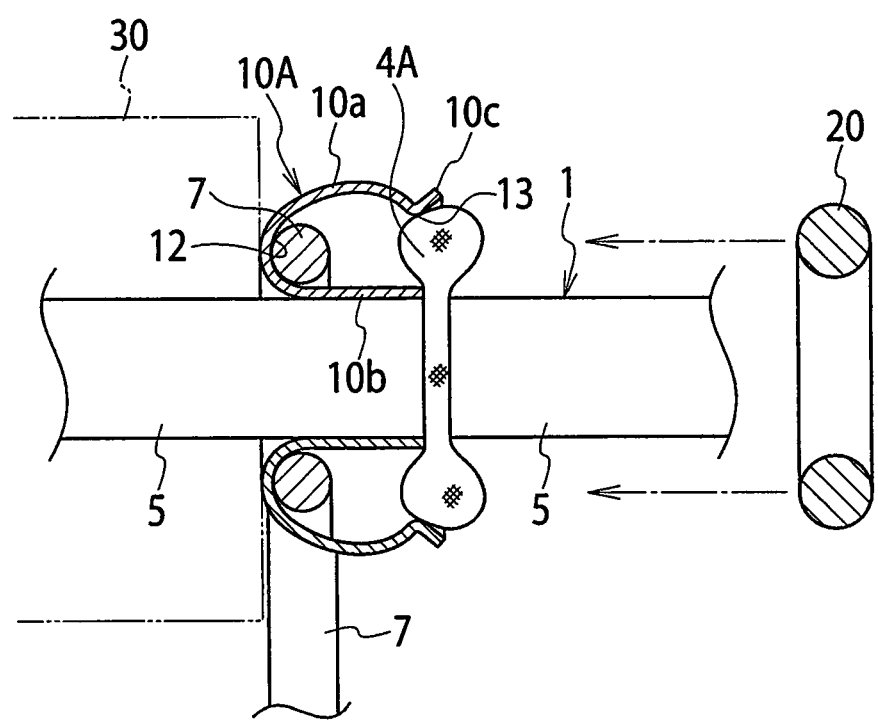
FIG. 14 is a sectional view showing a manufacture process of the ground connection structure according to the second embodiment of the present invention.

Then, as shown in FIG. 10, the annular member for grounding 10 is arranged around the outer circumference of the shield wire 1 fixed by a jig 30, by utilizing the notch 11. The annular member for grounding 10 is moved to a position in which the shield projecting portion 4A enters the slit 14 of the annular member for grounding 10.

Then, the push-in member 20 is inserted into the housing chamber 12 of the annular member for grounding 10 through the opening 13 to be located behind the shield projecting portion 4A. As a result, the shield projecting portion 4A is pushed in and gradually enters the housing chamber 12. If the push-in member 20 is inserted up to a position of the opening 13 of the housing chamber 12, the annular member for grounding 10 deforms elastically in directions to widen the width of the opening 13 and consequently insertion of the push-in member 20 is allowed. If the push-in member 20 is inserted into the housing chamber 12 completely, the annular member for grounding 10 makes return elastic deformation and restores the width of the opening 13 to the original width. As a result, the push-in member 20 is held within the housing chamber 12 without slipping off from the opening 13. If the push-in member 30 is housed within the housing chamber 12 completely, the inside of the housing chamber 12 is brought into a state having little space by the ground wire 7, the shield projecting portion 4A, and the push-in member 20. As a result, the ground wire 7 and the shield projecting portion 4A are positively brought into close contact with each other.

When arranging the annular member for grounding 10 around the outer circumference of the shield wire 1, the opening 13 of the annular member for grounding 10 may be simply set in a position opposed closely to the shield projecting portion 4A. In this case, the shield projecting portion 4A may be entered into the slit 14 in a process for inserting the push-in member 20 together with the shield projecting portion 4A into the housing chamber 12 of the annular member for grounding 10.

As described above, the ground connection structure for a shield wire includes the shield projecting portion 4A formed by exposing the shield layer 4 in the shield wire 1 in a state in which the shield layer 4 is projected outside of the exterior covering 5; the annular member for grounding 10 arranged in a position surrounding the outer circumference of the shield wire 1, the annular member for grounding 10 including the housing chamber 12 having the opening 13 along an annular shape and housing the ground wire 7; and the push-in member 20 inserted from the opening 13 together with the shield projecting portion 4A into the housing chamber 12 of the annular member for grounding 10. In the annular member for grounding 10, therefore, the shield projecting portion 4A and the ground wire 7 are brought into close contact with each other. Accordingly, any compressive force does not act on the insulation layer 3 of the shield wire 1. As a result, a situation in which the signal wire 2 is short-circuited to the shield layer 4 does not occur. At the time of manufacture work, it is sufficient to insert the push-in member 20 into the annular member for grounding 10 which is set around the outer circumference of the shield wire 1. It is not necessary to conduct troublesome caulking working. Owing to the points described above, there is no fear that the signal wire 2 will be short-circuited to the shield layer 4, and the work efficiency in manufacture is high.

The annular member for grounding 10 is elastically deformable in directions to expand the opening 13. The push-in member 20 is inserted into the housing chamber 12 by expanding the opening 13 of the housing chamber 12 with elastic deformation. After the push-in member 20 is inserted into the housing chamber 12, the opening 13 of the housing chamber 12 returns to the original size. As a result, the situation in which the push-in member 20 slips off from the housing chamber 12 can be prevented by a simple configuration.

Since the annular member for grounding 10 has the notch 11 formed by opening a partial area of the annular shape, it is easy to set the annular member for grounding 10 around the outer circumference of the shield wire 1.

The annular member for grounding 10 has the slits 14 opened to the opening 13 on the inner circumference wall 10b. Therefore, the shield projecting portion 4A of the shield wire 1 can enter the inner part of the housing chamber 12 of the annular member for grounding 10 easily. As a result, a stable close contact state between the shield projecting portion 4A and the ground wire 7 is obtained. The annular member for grounding 10 is made of conductive metal. Since the shield projecting portion 4A bites into the slit 14, positive electrical contact between the annular member for grounding 10 and the shield projecting portion 4A is obtained. Accordingly, positive conduction between the shield projecting portion 4A and the ground wire 7 is obtained via the annular member for grounding 10 as well. As a result, it is possible to connect the shield wire 4 to a ground potential more positively.

Second Embodiment

FIGS. 11 to 14 show a ground connection structure 50A for the shield wire 1 according to a second embodiment of the present invention. The ground connection structure 50A according to the second embodiment differs from the ground connection structure according to the first embodiment only in that the slits 14 are not provided in an annular member for grounding 10A. All of other configurations are the same. In FIGS. 11 to 14, therefore, the same configuration as that in the first embodiment is denoted by like reference character, and duplicated description will be omitted.

In the second embodiment as well, actions and effects similar to those in the first embodiment are obtained except actions and effects of the slits 14.

Third Embodiment

Figure 15:
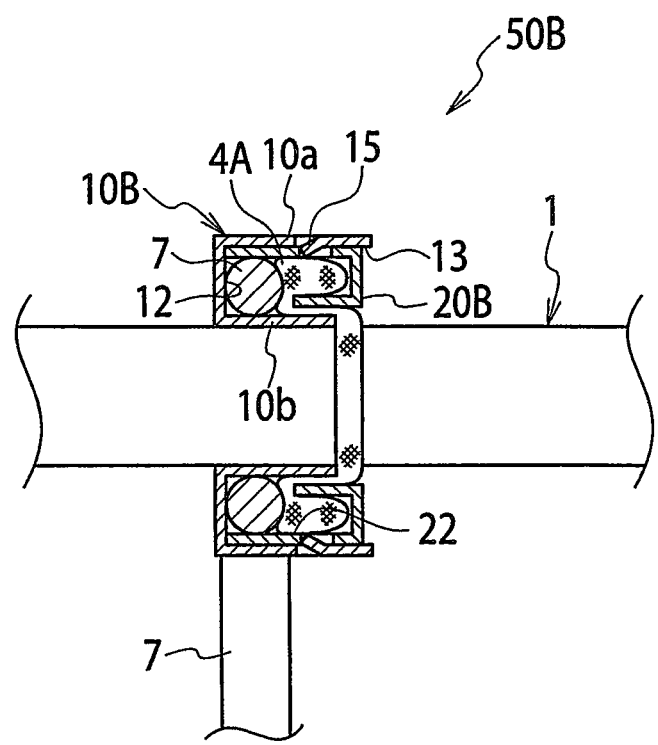
FIG. 15 is a sectional view of a ground connection structure for a shield wire according to a third embodiment of the present invention.
Figure 16:
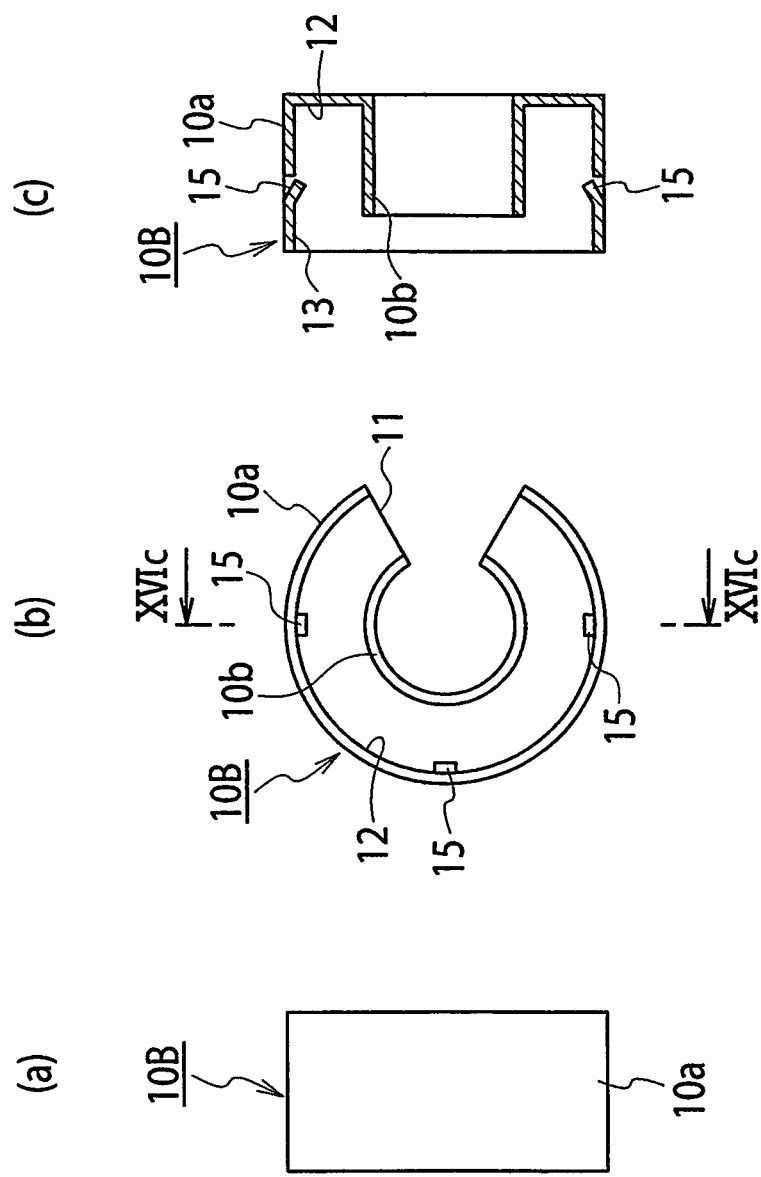
FIGS. 16(a) to 16(c) show the third embodiment of the present invention.
Figure 17:
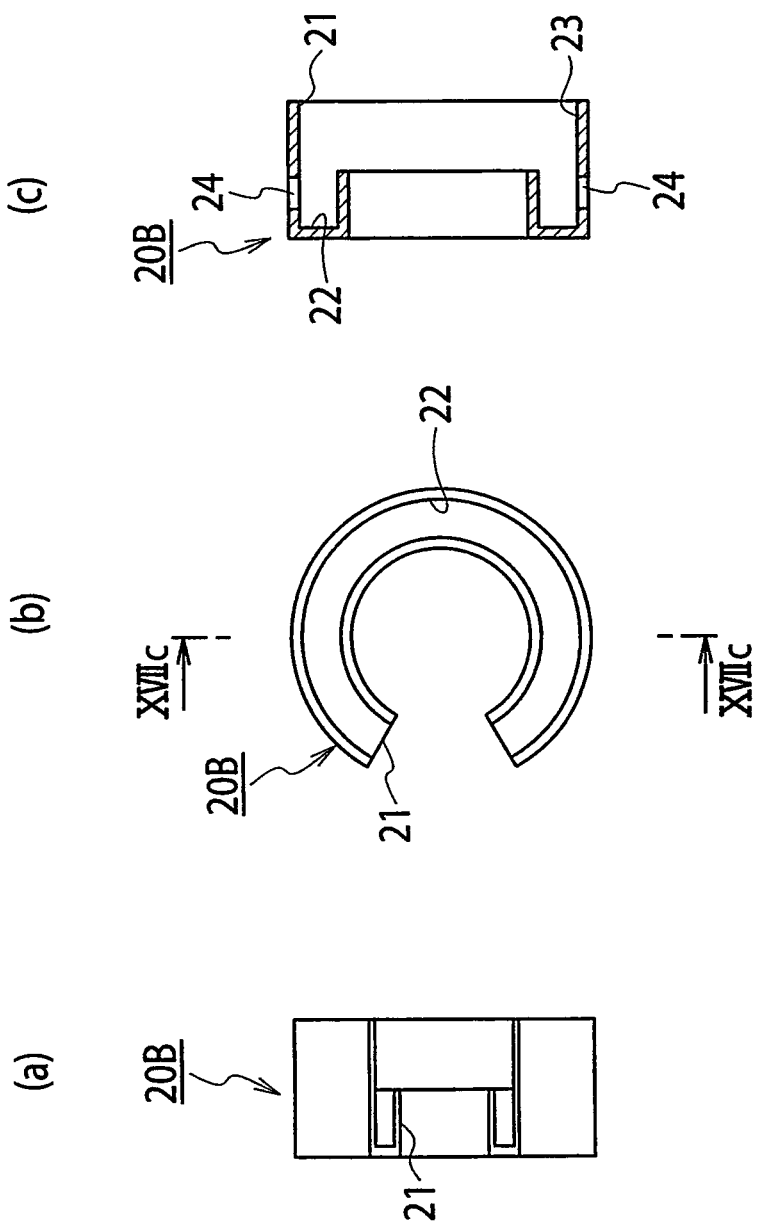
FIGS. 17(a) to 17(c) show the third embodiment of the present invention.

FIGS. 15 to 18 show a ground connection structure 50B for the shield wire 1 according to a third embodiment of the present invention. In FIG. 15, the shield projecting portion 4A of the shield wire 1 is brought into close contact with the ground wire 7 by an annular member for grounding 10B and a push-in member 20B in the same way as the first and second embodiments. However, configurations of the annular member for grounding 10B and the push-in member 20B are different as described hereafter.

As shown in detail in FIGS. 16(a) to 16(c), the annular member for grounding 10B is made of conductive metal and is an annular member having a notch 11 formed by opening a partial area. However, a cross section takes a shape of nearly a rectangular frame.

The annular member for grounding 10B has a housing chamber 12 inside. In the housing chamber 12, an opening 13 is formed along an annular shape. On an outer circumference wall 10a of the annular member for grounding 10B, locking claws 15 formed by cutting and raising work are provided in a plurality of places at intervals. Respective locking claws 15 project into the housing chamber 12.

As shown in detail in FIGS. 17(a) to 17(c), the push-in member 20B is made of conductive metal and is an annular member having a notch 21 formed by opening a partial area. A cross section of the push-in member 20B takes a shape of nearly a rectangular frame. A width of the push-in member 20B is slightly smaller than a width of the housing chamber 12 of the annular member for grounding 10B, and is set to a dimension to make it possible for the push-in member 20B to be inserted into the housing chamber 12. A housing chamber 22 is formed in the push-in member 20B as well. An opening 23 is formed for the housing chamber 22 along an annular shape. On an outer circumference wall 20a of the push-in member 20B, locking holes 24 are provided in a plurality of places at intervals. As shown in FIG. 15, the locking claws 15 of the annular member for grounding 10B are locked by the locking holes 24, respectively. As a result, the push-in member 20B is prevented from slipping off from the housing chamber 12 in the annular member for grounding 10B.

An assembling procedure of the ground connection structure 50B for the shield wire 1 will now be described briefly. Since working of the shield wire 1 is similar to that in the first and second embodiments, description thereof will be omitted.

Figure 18:
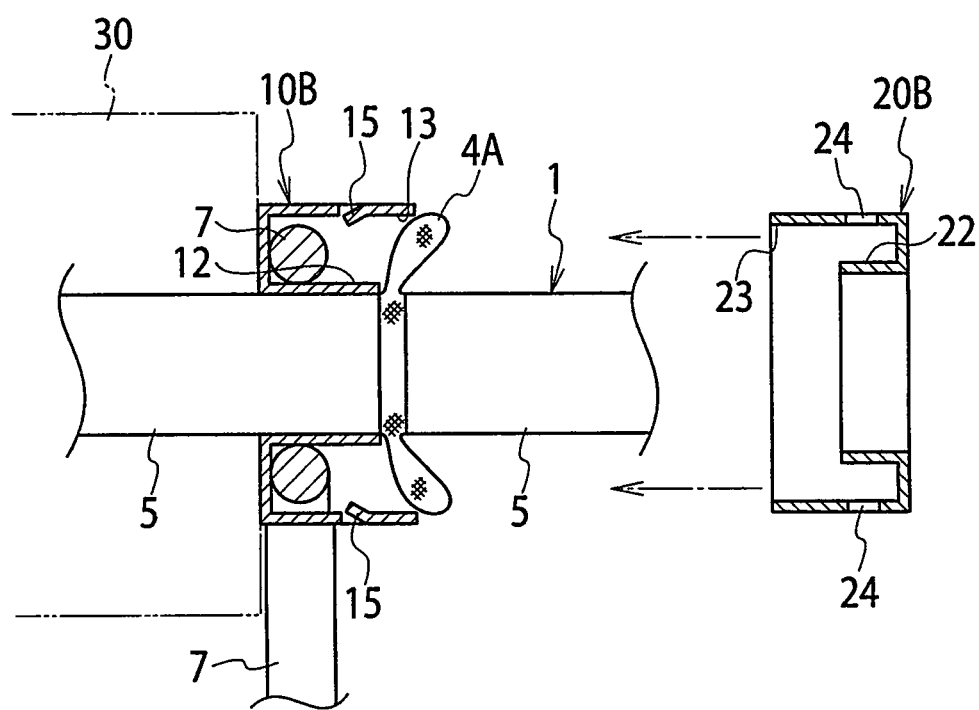
FIG. 18 is a sectional view showing a manufacture process of the ground connection structure according to the third embodiment of the present invention.

If working of the shield wire 1 is finished, an end part of the ground wire 7 is housed into the housing chamber 12 of the annular member for grounding 10B. Then, as shown in FIG. 18, the annular member for grounding 10B is set in a position around an outer circumference of the shield wire 1 fixed by a jig 30 where the opening 13 opposes the shield projecting portion 4A in close vicinity, by utilizing the notch 11 of the annular member for grounding 10B.

Then, the push-in member 20B is inserted into the housing chamber 12 of the annular member for grounding 10B through the opening 13 to be located behind the shield projecting portion 4A. As a result, the shield projecting portion 4A is pushed in and gradually enters the housing chamber 12. If the push-in member 20B is inserted completely, the locking claws 15 of the annular member for grounding 10B are locked by the locking holes 24 of the push-in member 20B, respectively. As a result, the push-in member 20B is held within the housing chamber 12 without slipping off from the opening 13. If the push-in member 20B is housed within the housing chamber 12 completely, the inside of the housing chamber 12 is brought into a state having little space by the ground wire 7, the shield projecting portion 4A, and the push-in member 20B. (In other words, insides of both the housing chambers 12 and 22 are brought into a state having little space by the ground wire 7 and the shield projecting portion 4A.) As a result, the ground wire 7 and the shield projecting portion 4A are brought into a state of close contact.

In the third embodiment described above as well, the shield projecting portion 4A and the ground wire 7 are brought into close contact with each other in the annular member for grounding 10B, in the same way as the first and second embodiments. Accordingly, any compressive force does not act on the insulation layer 3 of the shield wire 1. As a result, a situation in which the signal wire 2 is short-circuited to the shield layer 4 does not occur. At the time of manufacture work, it is sufficient to insert the push-in member 20B together with the shield projecting portion 4A into the annular member for grounding 10B which is set around the outer circumference of the shield wire 1. It is not necessary to conduct troublesome caulking working. Owing to the points described above, there is no fear that the signal wire 2 will be short-circuited to the shield layer 4, and the work efficiency in manufacture is high.

The annular member for grounding 10B has the locking claws 15 which project into the housing chamber 12. The push-in member 20B inserted into the housing chamber 12 is locked by the locking claws 15. As a result, the situation in which the push-in member 20B slips off from the housing chamber 12 can be prevented positively.

Since the annular member for grounding 10B has the notch 11 formed by opening a partial area of the annular shape, it is easy to set the annular member for grounding 10B around the outer circumference of the shield wire 1.

Slits opened to the opening 13 may be provided on the inner circumference wall 10b of the annular member for grounding 10B in the same way as the first embodiment. If slits are provided on the inner circumference wall 10b, the shield projecting portion 4A of the shield wire 1 can enter the inner part of the housing chamber 12 of the annular member for grounding 10B easily. As a result, a stable close contact state between the shield projecting portion 4A and the ground wire 7 is obtained.

In the first and second embodiments, one end part of the ground wire 7 is housed into the housing chamber 12 of the annular member for grounding 10 earlier than the shield projecting portion 4A. However, the present invention is not restricted to this. The shield projecting portion 4A may be housed into the housing chamber 12 of the annular member for grounding 10 earlier than the one end part of the ground wire 7.

Embodiments of the present invention are described in the above. However, the present invention is not limited to the above embodiments and various modifications can be performed.

The invention claimed is:

1. A ground connection structure for a shield wire, comprising:
 a shield projecting portion being a part of a shield layer of the shield wire projected outside of an exterior covering to be exposed;
 an annular member for grounding disposed in a position surrounding an outer circumference of the shield wire, the annular member for grounding including a housing chamber having an opening along an annular shape of the annular member for grounding and being configured to house the shield projecting portion and a ground wire inserted from the opening in an insertion direction; and
 a push-in member insertable from the opening in the insertion direction and housable in the housing chamber after insertion of the ground wire and the shield projecting portion, the push-in member housed in the housing chamber bringing the shield projecting portion and the ground wire into close contact with each other,
 wherein the shield projecting portion housed in the housing chamber is sandwiched in the insertion direction between the ground wire and the push-in member housed in the housing chamber such that the push-in member, the shield projecting portion, and the ground wire are arranged in an order of the push-in member, the shield projecting portion, and the ground wire in the insertion direction and a compressive force acting on the shield wire in a direction perpendicular to the insertion direction is prevented,
 wherein the annular member for grounding comprises an inner circumference wall and an outer circumference wall defining the housing chamber, and wherein the ground wire and the shield projecting portion housed in the housing chamber are in close contact with each other in the housing chamber and the push-in member and the shield projecting portion housed in the housing chamber are in close contact with each other in the housing chamber.

2. The ground connection structure for a shield wire according to claim 1, wherein
the annular member for grounding is elastically deformable in directions to expand the opening,
the push-in member is insertable into the housing chamber by elastic expansion of the opening, and
the opening of the housing chamber is configured to return to an original size after insertion of the push-in member into the housing chamber.

3. The ground connection structure for a shield wire according to claim 1, wherein the annular member for grounding includes locking claws configured to project into the housing chamber and lock the push-in member inserted into the housing chamber.

4. The ground connection structure for a shield wire according to claim 1, wherein each of the annular member for grounding and the push-in member includes a notch formed by opening a part of an annular shape.

5. The ground connection structure for a shield wire according to claim 1, wherein the annular member for grounding includes slits open to the opening on the inner circumference wall of the annular member for grounding.

6. The ground connection structure for a shield wire according to claim 1, wherein the shield layer is formed of a braid wire or metal foil.

7. The ground connection structure for a shield wire according to claim 1, wherein one end side of the ground wire with an exterior covering stripped off is housed in the housing chamber on a vehicle and another end of the ground wire is connected to a vehicle body.

8. The ground connection structure for a shield wire according to claim 1, wherein the push-in member is made of conductive metal.

9. The ground connection structure for a shield wire according to claim 1, wherein the push-in member has a diameter that is slightly larger in dimension than the width of the opening of the annular member for grounding.

10. The ground connection structure for a shield wire according to claim 1, wherein the shield projecting portion is projected outside of an intermediate place of the exterior covering to be exposed where the ground wire is to be connected.

* * * * *